United States Patent [19]
Kim

[11] Patent Number: 6,094,380
[45] Date of Patent: Jul. 25, 2000

[54] MEMORY DEVICE WITH A DATA OUTPUT BUFFER AND THE CONTROL METHOD THEREOF

[76] Inventor: Jung Pill Kim, c/o, Hyundai Electronics Industries Co., Ltd., San 136-1, Ami-ri, Bubal-eub, Ichon-shi, Kyoungki-do, Rep. of Korea

[21] Appl. No.: 09/221,344

[22] Filed: Dec. 28, 1998

[30] Foreign Application Priority Data

Dec. 31, 1997 [KR] Rep. of Korea ................ 97-81300

[51] Int. Cl.[7] .................................................. G11C 7/00
[52] U.S. Cl. ........................................ 365/194; 365/233
[58] Field of Search .................................. 365/233, 194, 365/211, 212; 327/291, 299

[56] References Cited

U.S. PATENT DOCUMENTS

| | | | |
|---|---|---|---|
| 5,077,693 | 12/1991 | Hardee et al. | 365/230.08 |
| 5,402,389 | 3/1995 | Flannagan et al. | 365/233 |
| 5,566,108 | 10/1996 | Kitamura | 365/233 |
| 5,608,688 | 3/1997 | Park | 365/233.5 |
| 5,631,866 | 5/1997 | Oka et al. | 365/189.05 |
| 5,648,931 | 7/1997 | Obara | 365/189.05 |
| 5,663,912 | 9/1997 | Yamauchi | 365/194 |
| 5,781,499 | 7/1998 | Koshikawa | 365/233 |
| 5,955,904 | 9/1999 | Kawasaki | 327/156 |
| 5,956,290 | 9/1999 | Matsuzaki | 365/233 |

*Primary Examiner*—Son Mai
*Attorney, Agent, or Firm*—Townsend and Townsend and Crew LLP

[57] ABSTRACT

A memory device with a data output buffer outputs the read data from the memory cell array without error and provides sufficent time in outputting the data. A memory device with a data output buffer means comprises a clock input buffer means for receiving an external clock and outputting an internal clock; and a delay means for delaying a specified time the internal clock outputted from the clock input buffer means; wherein the operation of the data output buffer means is controlled by the delayed internal clock outputted from the delay means.

20 Claims, 8 Drawing Sheets

MEMORY DEVICE WITH A DATA OUTPUT BUFFER AND THE CONTROL METHOD THEREOF

BACKGROUND OF THE INVENTION

1. Field of the Invention

The present invention relates to a memory device with a data output buffer and the control thereof, and more particularly, to a memory device which outputs the read data from the memory cell array without error and provides sufficient time in outputting the data, and the control method thereof.

2. Discussion of Related Art

In general, it is preferable to transfer accurately the read data from the memory device to the external system. To accomplish such a stable operation, it is required to maintain in a stable state the driving capability or operating state of the memory device. However, the driving capability of the memory device generally is varied by the variations of the pheripheral temperature or the driving voltage.

On account of such reasons, the data state outputted from the output buffer of the memory device may be unstable. That is, characteristics of the transistors may be unstable and the operating time of the clock signals generated in the memory device may be inaccurate. Therefore, if the operating time is unstable, the time interval of the output data is varied. In connection with this phenomenon, a data window time is defined, which denotes the time interval for acquiring a stable data. In general, the data window time has been much more important as the data process speed has improved, i.e., as the operation speed of the memory device has been enhanced.

FIG. 1 is a block diagram of a conventional memory device, and is shown to explain the output process which outputs the data within the memory device through a plurality of pipe means to the data output buffer. Hereinbelow, the conventional data output method will be described in detail with reference to FIG. 1. Although FIG. 1 shows Synchronous DRAM which has a pipe function, any other various storing devices, such as general DRAM or registers which can store data, may be applicable to this case.

As shown in FIG. 1, the clock input buffer 1 receives an external clock, and generates an internal clock which has a preferable voltage level necessary to the operation of the memory device.

The pipe counter generator 2 receives the internal clock outputted from the clock input buffer 1. The pipe counter generator 2 also receives a plurality of pipe counter enable signals pcnt-en0, pcnt-en1, and pcnt-en2 which are determined in relation to the CAS latency and burst length.

Wherein, the CAS latency indicates a time interval between the timing when the external clock is inputted and the timing when the data is outputted through the data output buffer of memory device, and generally is expressed as the number of the inputted external clocks until the output timing of the data from the memory device. Accordingly, the CAS latency is related to the speed of the data process.

The burst operation processes to generate sequentially a series of commands by a certain specified command. The operation speed of the memory device is increased by the burst operation which is one of the sequential burst and interleave burst operations. In general, the burst operation is used to generate a series of addresses in memory device. In this case, the number of the generated addresses is a burst length.

The pipe counter generator receives the internal clock and a plurality of pipe counter enable signals pcnt-en0, pcnt-en1, and pcnt-en2; and outputs a plurality of pipe counter signals pcnt0, pcnt1, and pcnt2. The pipe counter signals pcnt0, pcnt1, and pcnt2 are delayed by the CAS latency and controls the pipe latch circuit 3.

The pipe latch circuit 3 latches the data read from memory cell array during the read mode of the memory device. The data are inputted to the pipe latches of the pipe latch circuit 3. The pipe latch circuit 3 latches the received data during a specified time. The latched data in the pipe latches are selectively outputted in response to the pipe counter signals.

As shown in FIG. 1, the signals pl-out outputted from the pipe latch circuit are inputted to the data output buffer means 4 which includes many data output buffers. The data output buffer means stores and buffers the signals, i.e. the data RD, during a specified time.

FIGS. 2a to 2d are detailed circuits of a block diagram in FIG. 1.

FIG. 2a is a circuit diagram of the clock input buffer in FIG. 1. As shown in FIG. 2a, the clock input buffer includes a differential amplifier and a current mirror circuit. Therefore, the clock input buffer 1 compares the external clock ext_clk with the reference voltage Vref, and also converts the voltage level of the external clock into a CMOS voltage level which is used as the level of the internal clock.

FIG. 2b is a circuit diagram of the pipe counter generator 2 in FIG. 1. As shown in FIG. 2b, the pipe counter generator receives the internal clock outputted from the clock input buffer. The internal clock is inputted at the drain terminal of the transistor N1. The pipe counter enable signals are inputted at the gate terminal of the transistor N1. The pipe counter generator 2 outputs the pipe counter signals pcnt0, pcnt1, and pcnt2 in response to the internal clock and the pipe counter enable signals pcnt_en0, pcnt_en1, and pcnt_en2. If the reset signal is activated, output of the pipe counter signals pcnt0, pcnt1, and pcnt2 are disabled with low level. Namely, the PMOS P1 and NMOS N1 transistors of the pipe counter generator 2 maintains the initial state of the generator with low level Vss during the standby mode. FIG. 2c is a pipe latch circuit shown in FIG. 1, and includes flip-flops in order to latch the data RD outputted from the memory cell array. The pipe counter signals pcnt0, pcnt1, and pcnt2 control the corresponding flip-flops to output the data in sequence.

The data pl_out outputted from the pipe latch circuit 3 are inputted to the data output buffer.

FIG. 2d shows circuit diagram of the data output buffer. The data output buffer 4 stores the output data pl_out from the pipe latch circuit 3 and outputs the data to external systems.

FIGS. 3a to 3h are waveform diagrams in the prior art.

FIG. 3a is a waveform of the external clock Ext_clk, and FIG. 3b is a waveform of the internal clock Int_clk. FIGS. 3c to 3e are waveforms of the pipe counter enable signals pcnt_en0, pcnt_en1, and pcnt_en2. FIG. 3f is data read from the memory cell array. FIG. 3g is the waveform of the output from the pipe latch circuit, and FIG. 3h is output from the data output buffer.

In FIG. 3, CAS latency is 3 and burst length is 4. In other words, because the data in FIG. 3h are not outputted until the number of the external clock inputted in FIG. 3a is 3, CAS latency is 3. Further, as shown in FIG. 3f, because four data are continually outputted from the memory cell array, burst length is 4. The reason is that four addresses are continually generated in memory device in response to one address which is inputted externally.

As shown in FIGS. 2 and 3, the reset of the pipe counter signal pcnt0 is determined by the pipe counter signal pcnt1, the reset of the pipe counter signal pcnt1 is determined by the pipe counter signal pcnt2, and the reset of the pipe counter signal pcnt2 is determined by the pipe counter signal pcnt0. The lines at the rising and falling edges of the clocks indicate the variation of the operation timing which is caused by the variations of the temperature and/or voltages of the pheripheral circuit.

In general, a clock access time tAC, a data window time tDW, and a output hold time tOH are varied by the variations of the temperature and/or voltages.

In particular, the reasons of the variation of the clock access time tAC are as follows. The first reason is that the transfer speed is varied by the variation of the characteristics of the transistors while the external clock passes through the clock input buffer, the pipe counter, and the pipe latch circuit. The second reason is that the transfer speed is varied by the different locations of the data output buffers.

The output hold time tOH indicates a time interval from the timing when the external is applied to the timing when the data in output buffer is replaced with a new data. Accordingly, the output hold time tOH is also varied by the variation of the characteristics of the transistors, which is caused by the variation of the voltage and/or temperature.

The clock access time tAC indicates a time interval t1–t2 from the timing when the external clock is applied at time t1 to the timing when the first data is outputted last by the variation of the pheripheral characteristic t2. At worst, if the voltage source is lowered and the temperature is increased, the clock access time tAC is the longest.

The output hold time tOH indicates a time interval t3–t4 from the timing when the external clock is applied at time t3 to the timing when the first data is latched most shortly in the data output buffer by the variation of the pheripheral characteristic. At worst, if the voltage source is increased and the temperature is decreased, the output hold time tOH is the shortest. The data window time indicates a time interval t2–t4. The t2 indicates the timing when the data is outputted last by the variation of the pheripheral characteristic, and the t4 indicates the timing when the data is latched in short time by the variation of the pheripheral characteristic.

As described above, the worst cases from are that access time tAC and output hold time tOH are different each other. In addition, the data window time which indicates data latching time in the data output buffer may be unstable by the variation of voltage and/or temperature in the internal circuit. Also, an erroneous operation of a memory device may be caused by the shortened data window time.

SUMMARY OF THE INVENTION

Accordingly, it is an object of the present invention to provide a memory device with a data output buffer which overcome the aforementioned problems encountered in the conventional art.

To solve the aforementioned problems, there is provided a memory device with a data output buffer means comprising: clock input buffer means for receiving an external clock and outputting an internal clock; and delay means for delaying a specified time the internal clock outputted from the clock input buffer means; wherein the operation of the data output buffer means is controlled by the delayed internal clock outputted from the delay means.

In addition, there is provided a method for controlling a data output buffer means of memory device comprising: receiving an external clock and outputting an internal clock; delaying a specified time the internal clock outputted from the clock input buffer means; and controlling the operation of the data output buffer means of the memory device in response to the delayed internal clock.

Additional advantages, objects and other features of the invention will be set forth in part in the description which follows and in part will become apparent to those having ordinary skill in the art upon examination of the following or may be learned from the practice of the invention. The objects and advantages of the invention may be realized and attained as particularly pointed out in the appended claims as a result of the embodiment compared to the conventional arts.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

A preferred embodiment of the present invention will now be described with reference to the accompanying drawings.

Figure 1:
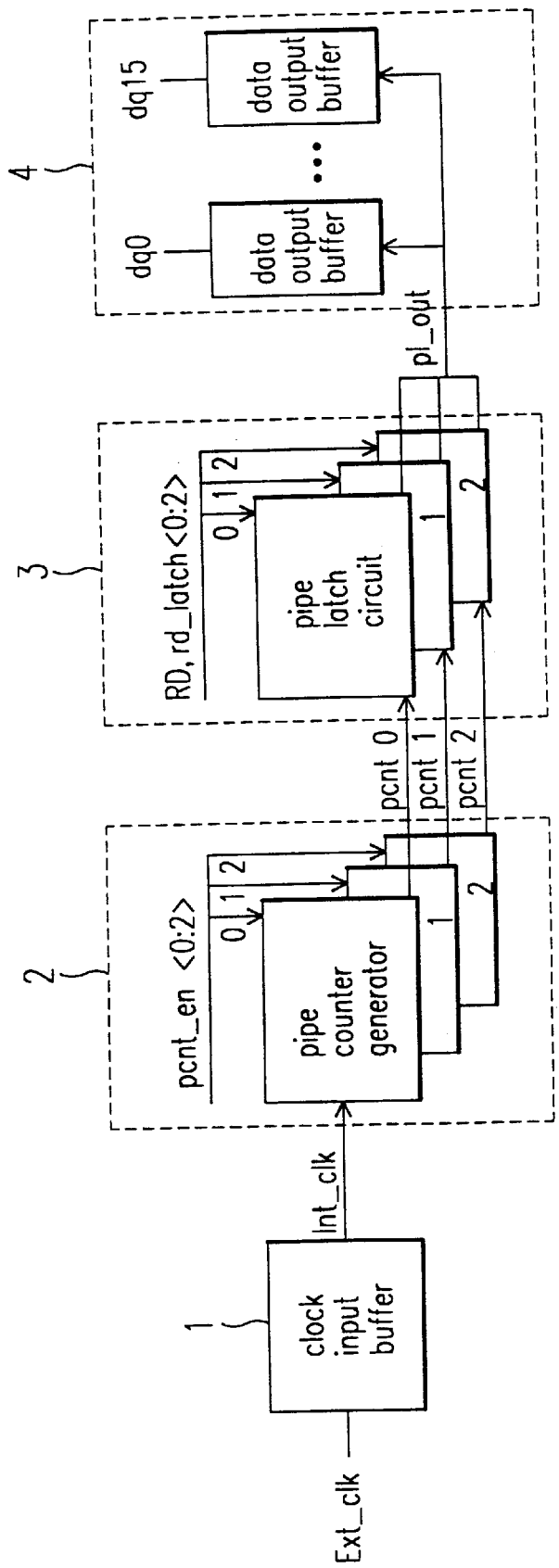
FIG. 1 is a block diagram of a conventional memory device with a data output buffer.
Figure 2A:
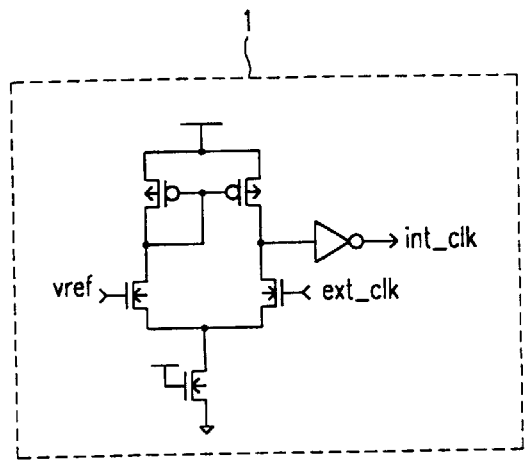
FIGS. 2a to 2d are detailed circuits of a block diagram in FIG. 1.
Figure 2B:
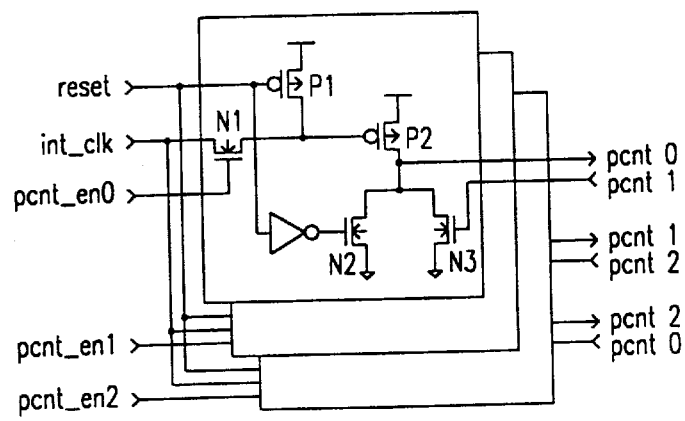
Figure 2C:
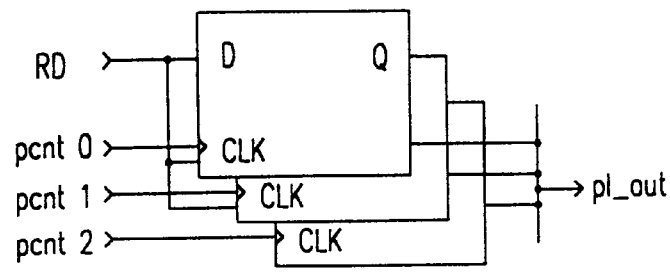
Figure 2D:
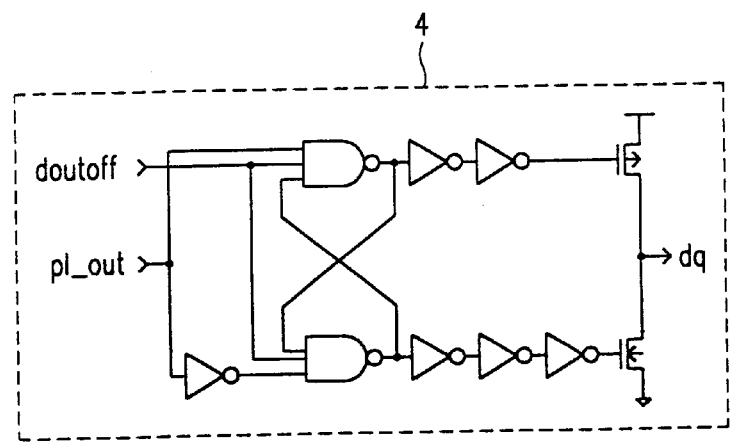
Figure 3:
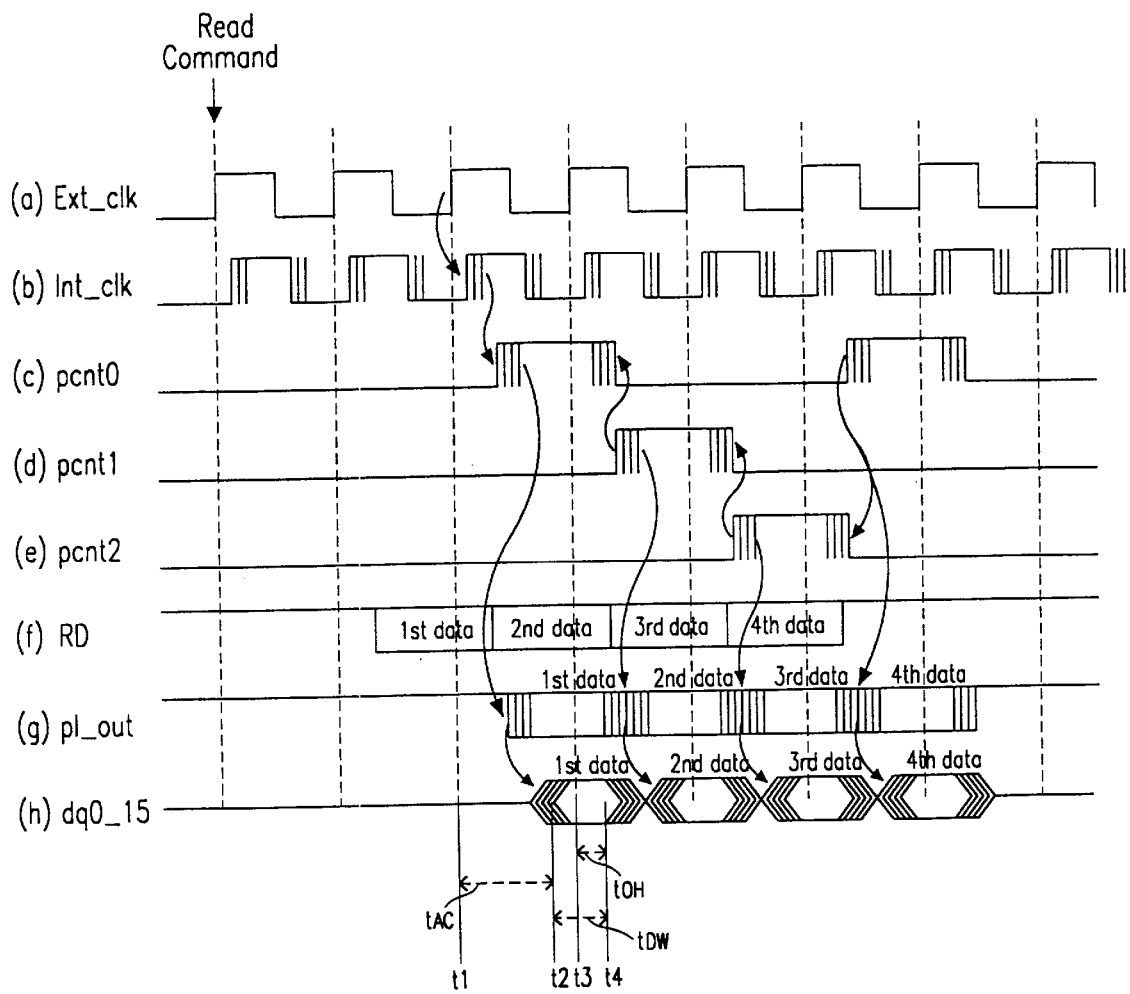
FIGS. 3a to 3h are waveform diagrams in FIG. 1.
Figure 4:
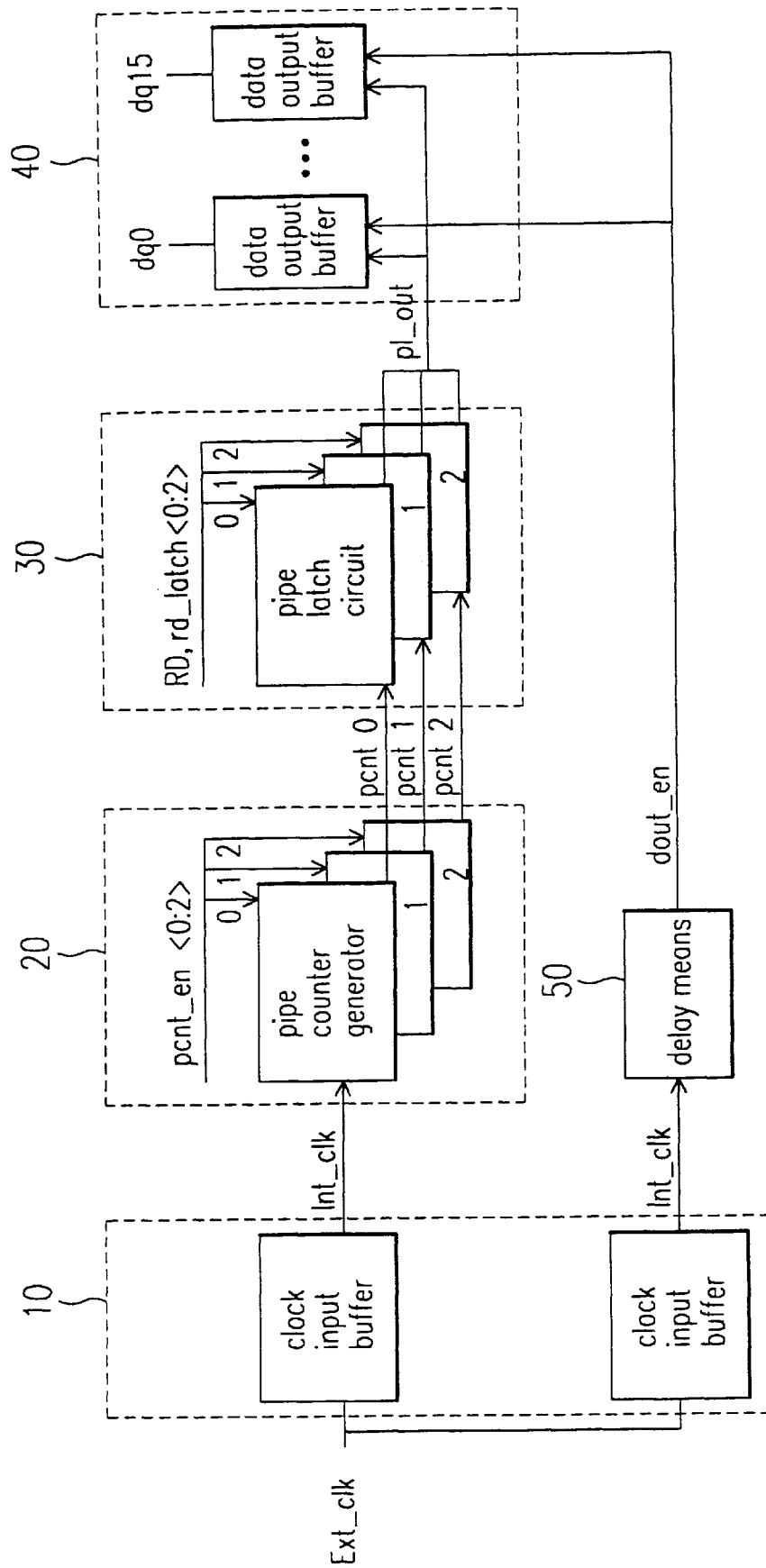
FIG. 4 is a block diagram of the memory device with a data output buffer according to the present invention.

FIG. 4 is a block diagram of the memory device with a data output buffer according to the present embodiment.

In FIG. 4, the memory device of the present embodiment includes a clock input buffer 10, a pipe counter generator 20, a pipe latch circuit 30, a data output buffer 40, and a delay means 50. In the embodiment, the constitutions and the operations of the pipe counter generator 20 and the pipe latch circuit 30 are substantially identical with the prior art.

A different thing between the present embodiment and the prior art is that the present embodiment includes a number of clock input buffers. The present embodiment includes two clock input buffers. However, it is possible to use more than two buffers in order to accomplish the object of the present invention. The constitutions of the clock input buffers utilized in the embodiment are alike. However, it is possible to use different types of the clock input buffers.

In another embodiment, it may be possible to use only one clock input buffer as an the prior art. In this case, the internal clock Int_clk outputted from the clock input buffer is inputted both to the pipe counter generator and the delay means.

Figure 5A:
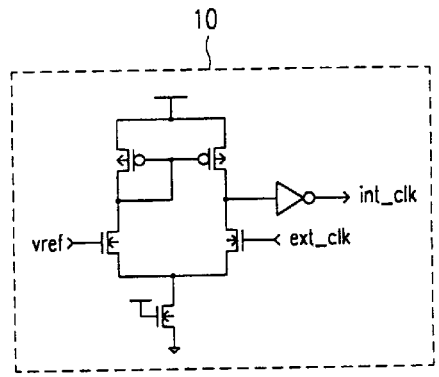
FIGS. 5a to 5c are detailed circuits of the delay components according to the present invention.

The function of the clock input buffers in FIG. 4 is similar to the prior art. That is, as shown in FIG. 5a, the clock input buffers compare the external clock ext_clk with the reference voltage Vref, and also convert the voltage level of the external clock into a CMOS voltage level which is used as the level of the internal clock.

Another difference between the present embodiment and the prior art is that the present embodiment includes a delay means 50 which receives the internal clock outputted from one of the clock input buffers.

As shown in FIG. 4, the delay means 50 receives the internal clock and outputs a specified time delayed clock signal. The clock signal outputted from the delay means 50 is a data output enable clock dout_en which enables the data output buffer means. A characteristic of the present embodiment is that the operation of the data output buffer means in FIG. 4 is controlled by the data output enable clock dout_en outputted from the delay means 50. It may be possible to construct the delay means by the use of a number of the clock input buffers.

The preferred embodiment will be described with reference to FIGS. 5 and 6.

Since the input buffer in FIG. 5a is substantially similar to the prior art, the description will be unnecessary.

Figure 5B:
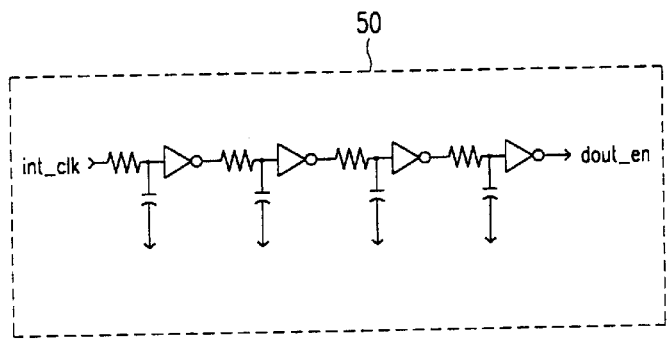
Figure 5C:
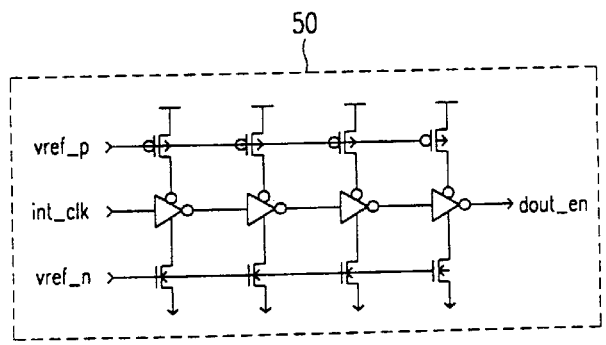

FIGS. 5b and 5c are examples of the detailed circuit of the delay means.

As shown in FIG. 5b, the delay means includes resistor components, capacitor components and a plurality of delay buffers. The temperature characteristic variation of the resistor components is relatively smaller than the peripheral circuit. The capacitor components may be embodied by using the transistors.

FIG. 5c is another example of the delay means.

In FIG. 5c, the delay means includes a number of delay buffers. The operation speed of the delay buffers is controlled by controlling the bias voltages of the delay buffers. For example, if the voltage level of the control signals vref_p and vref_n is increased, the operation speed of the delay buffers is also increased. As a result, the data output enable clock dout_en which is an output from the delay means is outputted in a short time. On the contrary, if the voltage level of the control signals vref_p and vref_n is decreased, the operation speed of the delay buffers is also decreased. As a result, a greater amount of time is required to output the data output enable clock dout_en.

If, for example, vref_p=Vcc−2Vth and vref_n=2Vth, then |Vgs|=|Vcc−2Vth−Vcc|=2Vth. Therefore, Vgs has no connection with the voltage source Vcc. The Vgs is the gate-source voltage of the PMOS transistors in FIG. 5c. Also, since the gate-source voltage of the NMOS transistors is also 2Vth, it has no connection with the voltage source Vcc, too. Accordingly, in this case, delay time of the delay means is stable.

Figure 6A:
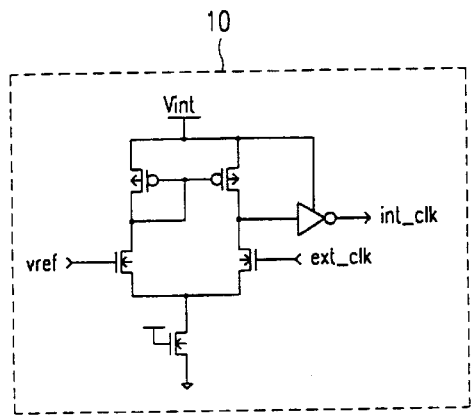
FIGS. 6a to 6c are detailed circuits of the delay components according to the present invention.

FIG. 6a is another example of the clock input buffer. The clock input buffer in FIG. 6a utilizes internal voltage Vint generated in the memory device instead of using the external voltage source.

Figure 6B:
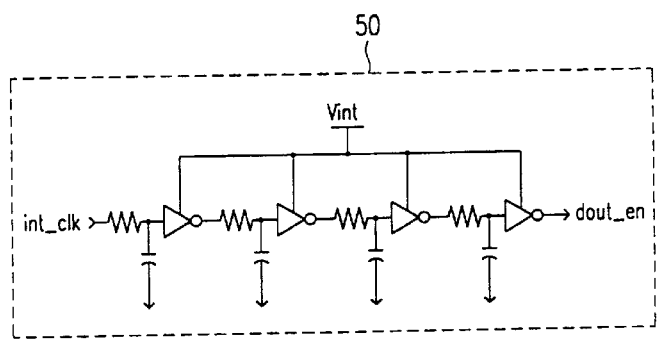

FIG. 6b is another example of the delay means. The different thing is that it utilizes internal voltage Vint as a bias voltage of the delay buffers. The function of the resistors and capacitors in FIG. 6b is substantially similar to that of the the resistors and capacitors in FIG. 5b.

Figure 6C:
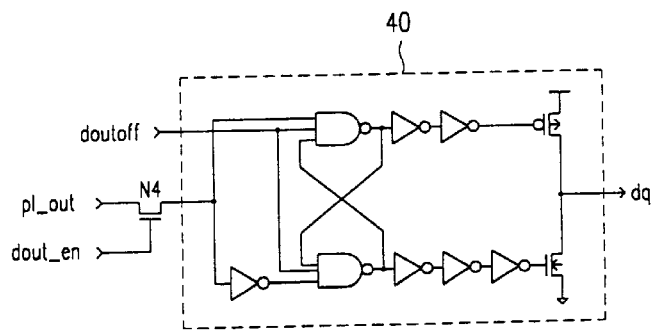

FIG. 6c shows a data output buffer. Contrary to the conventional art, the data output buffer of the present embodiment is controlled by the data output enable clock dout_en outputted from the delay means 50.

In the present embodiment, the signal pl_out which is an output from the pipe latch circuit is transferred to the data output buffer when the data output enable clock dout_en is enabled. Accordingly, the data output buffer is controlled by the delayed internal clock.

Figure 7:
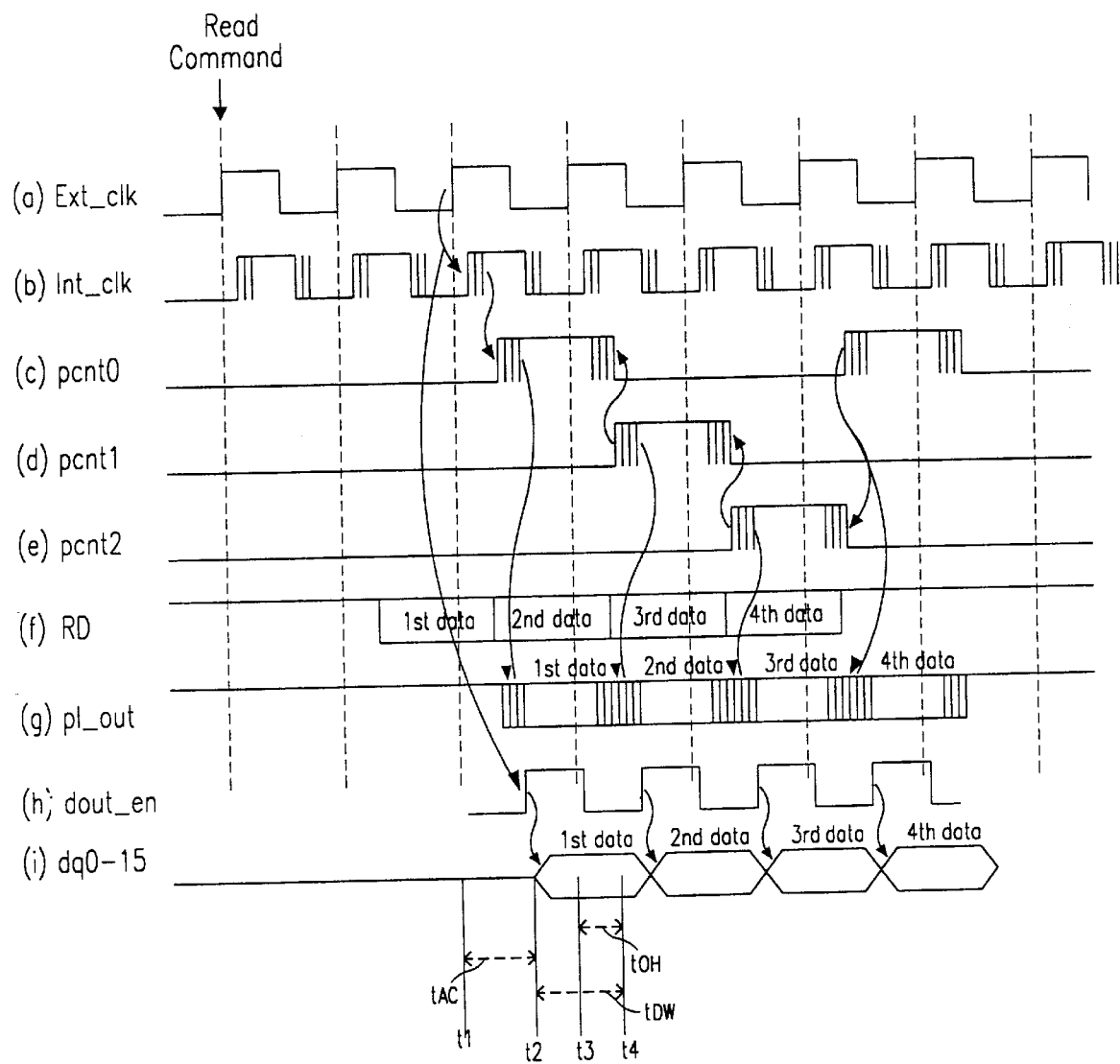
FIGS. 7a to 7i are waveform diagrams according to the present invention.

The reason why the present invention controls the data output buffer by using the delayed internal clock will now be described with reference to FIG. 7.

The waveforms of FIGS. 7a to 7b are substantially similar to those of the prior art.

That is, as shown in FIG. 7a, if the external clock Ext_clk is inputted to the clock input buffer means 10, the clock input buffer 10 compares the external clock Ext_clk with the reference voltage Vref and outputs the internal clock Int_clk shown in FIG. 7b. The pipe counter generator means generates a number of pipe counter signals pcnt0, pcnt1, and pcnt2 in sequence shown in FIGS. 7c to 7e.

The pipe latch circuit 30 outputs signal pl_out by the control of the output from the pipe counter generator 20. The signal pl_out is stored in the data output buffer 40.

As described above, waveforms in FIGS. 7a to 7g are identical to the prior art.

One of the fundamental characteristic of the present embodiment is shown in FIG. 7h which indicates the waveform of the delayed internal clock and in FIG. 7i which indicates the output waveform of the data output buffer.

As shown in FIG. 7g, the output timing of the data signal pl_out outputted from the pipe latch circuit 30 is varied by the variation of the peripheral environment such as temperature and/or voltage. On account of this variation, there is a problem in prior art that the output timing of the data to be outputted from the data output buffer is unstable.

The present embodiment, however, as shown in FIG. 7h, the delayed internal clock dout_en is activated at the time of the output of the signal pl_out which is to be outputted last. Thereafter, in synchronous with this timing, the data output buffer is enabled by the delayed internal clock dout_en outputted from the delay means 50. Accordingly, as shown in FIG. 7i, the data outputted from the output buffer are stabilized. Also, contrary to the prior art, the data window time in present embodiment is substantially identical to the cycle of the external clock, because the cycle of the delayed internal clock dout_en outputted from the delay means 50 is identical to the external clock.

As described above, the present invention has the following features.

The first feature is that the present invention includes a delay means which delays the external clock.

The second feature is that the data window time of the present invention is substantially made similar with the cycle of the external clock by using a delayed internal clock which controls the data output buffer.

As described above, the present invention includes a delay means for delaying the inputted external clock in order to preserve a stable data window time. The delay means of the present invention controls the activation of the data output buffer to enhance the data window time.

According to the present invention, even though the signals pcnt and pl_out etc are varied by the voltage or temperature, the data window time of the embodiment is equaled with the period T of the external clock by the control of the delay signal dout_en.

The present invention is applicable to not only SDRAM using an external clock but also general memory device using internal clock. Further, the present invention is applicable to a PCs with a memory device which is controlled at very high frequencies.

Also, the present invention mat be applicable to a variety of memory devices which input and output the data.

It is understood that various other modifications will be apparent to and can be readily made by those skilled in the art without departing from the scope and spirit of this invention.

Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A memory device comprising:

clock input buffer means for receiving an external clock and outputting an internal clock;

delay means for generating a data output enable clock by delaying the internal clock outputted from the clock input buffer means and for outputting the data output enable clock;

latch circuit means for latching and outputting data read from a memory cell array; and data output buffer means adapted to receive the data output enable clock from the delay means, for receiving and buffering data from the latch circuit means when the data output enable clock is enabled and for outputting the data received from the latch circuit means;

wherein the operation of the data output buffer means is controlled by the data output enable clock outputted from the delay means.

2. The memory device as claimed in claim 1, wherein the delay means includes resister components, capacitor components and a plurality of delay buffers; and wherein the temperature characteristic variation of the resistor components is relatively smaller than the temperature characteristic variation of an accompanying peripheral circuit coupled to the memory device.

3. The memory device as claimed in claim 1 or claim 2, wherein the data window time of the data outputted from the data output buffer means is identical with the time period of the external clock.

4. A memory device comprising:

clock input buffer means for receiving an external clock and outputting an internal clock;

delay means for delaying the internal clock outputted from the clock input buffer means for a specified time;

latch means for latching and outputting data read from at least one memory cell array; and data output buffer means adapted to receive the delayed internal clock from the delay means, for receiving and buffering data from the latch means when the delayed internal clock is enabled and for outputting the data received from the latch means;

wherein the operation of the data output buffer means is controlled by the delayed internal clock outputted from the delay means.

5. The memory device as claimed in claim 4, wherein the latch means conducts a pipe operation.

6. The memory device as claimed in claim 4, wherein the generating timing of the delayed internal clock which is to be outputted from the delay means is identical with the timing when the read data to be outputted from the latch means is outputted last, in order to control the data output buffer means.

7. The memory device as claimed in claim 4, wherein the delay means includes resistor components, capacitor components and a plurality of delay buffers; and wherein the temperature characteristic variation of the resistor components is relatively smaller than the temperature characteristic variation of an accompanying peripheral circuit coupled to the memory device.

8. The memory device as claimed in one of the claims 4 to 7, wherein the data window time of the data outputted from the data output buffer means is identical with the time period of the external clock.

9. A method for controlling a data output buffer means of a memory device comprising:

receiving an external clock and outputting an internal clock;

delaying the internal clock outputted from the clock input buffer means for a specified time;

latching data read from a memory cell array at a pipe latch circuit means;

receiving the data outputted from the pipe latch circuit means at the data output buffer means;

buffering the data outputted from the pipe latch circuit means in the data output buffer means when the delayed internal clock is enabled;

controlling the operation of the data output buffer means of the memory device in response to the delayed internal clock; and outputting the data read from the pipe latch circuit temporarily stored in the data output buffer means.

10. A method for controlling a data output buffer means of a memory device as claimed in claim 9, wherein the data window time of the data outputted from the data output buffer means is identical with the time period of the external clock.

11. A memory device comprising:

a clock input buffer means for receiving an external clock signal, for comparing the external clock signal with a reference voltage, and for converting the voltage level of the external clock signal into an internal clock signal;

a delay means for receiving the internal clock signal, for delaying the internal clock signal thereby generating a time delayed clock signal, and for outputting the time delayed clock signal;

a pipe latch circuit means for latching data read from a memory cell array and for outputting the data read from the memory cell; and a data output buffer means for receiving and buffering the data outputted from the pipe latch circuit means when the time delayed clock signal is enabled, and for outputting the data read from the pipe latch circuit means, wherein the operation of the data output buffer means is enabled and controlled by the time delayed clock signal.

12. The memory device of claim 11, wherein said output buffer means comprises a plurality of data output buffers.

13. The memory device of claim 11, wherein the clock input buffer means comprises a plurality of clock input buffers.

14. The memory device of claim 13, wherein the output of at least one of the plurality of clock input buffers converts the external clock signal to an internal clock signal received by the delay means and at least one of the plurality of clock input buffers converts the external clock signal to an internal clock signal received by a pipe counter generator.

15. The memory device of claim 11, wherein the internal clock signal comprises a CMOS voltage level.

16. The memory device of claim 11, wherein the time delayed output signal is a data output enable clock.

17. The memory device of claim 11, wherein the delay means comprises a plurality of delay buffers, said plurality of delay buffers having an operation speed that is controlled by biasing voltage, the delay of the time delayed clock signal being controlled by the operation speed.

18. The memory device of claim 17, wherein the biasing voltage is an internal voltage disposed at a location internal to the memory device.

19. The memory device of claim 11, wherein the time delayed clock signal causes the data window time of the data outputted from the data output buffer means to be identical to the cycle of the external clock signal.

20. A method for controlling a data output buffer means of a memory device comprising:

receiving an external clock signal at a clock input buffer means;

comparing the external clock signal with a reference voltage;

converting the voltage level of the external clock signal into an internal clock signal;

outputting the internal clock signal from the clock input buffer means;

receiving the internal clock signal at a delay means;

delaying the internal clock signal thereby generating a time delayed clock signal;

outputting the time delayed clock signal from the delay means to the data output buffer means;

latching data read from a memory cell array at a pipe latch circuit means;

outputting the data from the pipe latch circuit means to the data output buffer means;

buffering the data outputted from the pipe latch circuit means at the data output buffer means when the time delayed clock signal is enabled; and outputting the data read from the pipe latch circuit from the data output buffer means.

* * * * *